United States Patent
Brunner et al.

(10) Patent No.: US 9,915,713 B2
(45) Date of Patent: Mar. 13, 2018

(54) DETERMINING POSITIONS OF A MAGNETIC FIELD PROBE IN A MAGNETIC RESONANCE MEASUREMENT

(75) Inventors: David Brunner, Jona (CH); Christoph Barmet, Zurich (CH); Klaas Prussmann, Zurich (CH); Maximilian Häberlin, Zurich (CH)

(73) Assignees: Universitat Zurich, Zurich (CH); Eidgenossische Technische Hochschule (ETH), Zurich (CH)

( * ) Notice: Subject to any disclaimer, the term of this patent is extended or adjusted under 35 U.S.C. 154(b) by 858 days.

(21) Appl. No.: 14/112,655

(22) PCT Filed: Apr. 20, 2012

(86) PCT No.: PCT/EP2012/057330
§ 371 (c)(1),
(2), (4) Date: Feb. 28, 2014

(87) PCT Pub. No.: WO2012/143540
PCT Pub. Date: Oct. 26, 2012

(65) Prior Publication Data
US 2014/0292329 A1 Oct. 2, 2014

(30) Foreign Application Priority Data

Apr. 22, 2011 (EP) .................................. 11163614

(51) Int. Cl.
*G01R 33/44* (2006.01)
*G01R 33/28* (2006.01)
*G01R 33/58* (2006.01)

(52) U.S. Cl.
CPC ........... *G01R 33/44* (2013.01); *G01R 33/287* (2013.01); *G01R 33/58* (2013.01)

(58) Field of Classification Search
CPC ...... G01R 33/44; G01R 33/287; G01R 33/58; G01R 33/34084; G01R 33/3415;
(Continued)

(56) References Cited

U.S. PATENT DOCUMENTS

| 5,307,808 A | 5/1994 | Dumoulin et al. |
| 6,275,722 B1 | 8/2001 | Martin et al. |

(Continued)

FOREIGN PATENT DOCUMENTS

| EP | 0 911 642 A2 | 4/1999 |
| EP | 1 437 601 A1 | 7/2004 |

(Continued)

OTHER PUBLICATIONS

D.O. Brunner et al., "Autocalibration of Field Monitoring Arrays by Reference Tones", Proc. Intl. Soc. Mag. Reson. Med. 19 (2011), p. 1841.

(Continued)

*Primary Examiner* — Clayton E Laballe
*Assistant Examiner* — Ruifeng Pu
(74) *Attorney, Agent, or Firm* — George Pappas

(57) ABSTRACT

A method of determining the position of at least one magnetic field probe located within a pre-defined volume of interest within a magnetic resonance (MR) imaging or spectroscopy arrangement comprises applying a spatially and temporally variable magnetic reference field having a unique time-course at every point in said volume of interest during a preselected time window. An MR signal is acquired from said magnetic field probe during said time window, and the position of the probe is determined from the probe MR signal.

2 Claims, 3 Drawing Sheets

(58) Field of Classification Search
CPC .. G01R 33/0322; G01R 33/24; G01R 33/243; G01R 33/34007; G01R 33/341; G01R 33/36; G01R 33/365; G01R 33/3657; G01R 33/385; G01R 33/3875; G01R 33/481; G01R 33/4814; G01R 33/56563; G01R 33/5659; G01R 33/005
See application file for complete search history.

(56) References Cited

U.S. PATENT DOCUMENTS

| | | | | |
|---|---|---|---|---|
| 6,294,916 | B1* | 9/2001 | Burl | G01R 33/385 324/318 |
| 2004/0199067 | A1* | 10/2004 | Bock | G01R 33/287 600/411 |
| 2011/0166437 | A1* | 7/2011 | Chang | G01R 33/34084 600/411 |
| 2012/0101362 | A1* | 4/2012 | Weiss | A61M 25/0021 600/411 |
| 2013/0307535 | A1* | 11/2013 | Taracila | G01R 33/3415 324/307 |
| 2013/0307541 | A1* | 11/2013 | Paul | G01R 33/36 324/318 |
| 2014/0347049 | A1* | 11/2014 | Tsai | G01R 35/005 324/307 |

FOREIGN PATENT DOCUMENTS

| | | |
|---|---|---|
| EP | 1 582 886 A1 | 10/2005 |
| WO | WO 2007/118715 A1 | 10/2007 |

OTHER PUBLICATIONS

P. Sipila et al., "2H Transmit-Receive NMR Probes for Magnetic Field Monitoring in MRI", Magnetic Resonance in Medicine 65:1498-1506 (2011).

C. Barmet et al., "Spatiotemporal Magnetic Field Monitoring for MR", Magnetic Resonance in Medicine 60:187-197 (2008).

C. Barmet et al., "Concurrent higher-order field monitoring for routine head MRI: an integrated heteronuclear setup", ISMRM 2010, p. 216.

* cited by examiner

DETERMINING POSITIONS OF A MAGNETIC FIELD PROBE IN A MAGNETIC RESONANCE MEASUREMENT

This application claims priority from PCT application No. PCT/EP2012/057330 filed Apr. 20, 2012 which claims priory from European application No. EP 11163614.8 filed on Apr. 22, 2011, the disclosures of which are incorporated herein by reference.

FIELD OF THE INVENTION

The present invention generally relates to a method of determining positions of a magnetic field probe in a magnetic resonance (MR) imaging or spectroscopy measurement.

BACKGROUND OF THE INVENTION

Monitoring of gradient waveforms concurrently with MRI scans has been shown to be an effective means of correcting image reconstruction from data acquired in the presence of gradient waveform imperfections, eddy currents and field drifts (Barmet C et al. *MRM* 60(1), 2008; and Barmet C. *ISMRM* 2010 p. 216). For this purpose, it is known to use small magnetic field detectors exploiting the magnetic field dependence of a magnetic resonance transition. In the applications described so far, these so-called MR-type magnetic field probes are rigidly mounted in the periphery of the imaging volume. To derive the global field evolution from the signals of these probes, their positions need to be measured in a calibration step. This requirement not only extends the scan protocol but also precludes field monitoring with field probes that are subject to displacements, e.g., along with surface coil arrangements.

In many circumstances it would be highly desirable to have some kind of automatic position calibration of the magnetic field probes during actual field monitoring.

EP 0 911 642 A2 discloses a method and an apparatus for determining the location of a magnetic probe within the anatomy of a patient by means of ESR. The method includes the steps of placing an electron spin resonance sample in a known position with respect to a surgical instrument, placing the sample within the imaging reason of an MR apparatus, applying at least a first gradient magnetic field in the imaging region, and determining the resonant frequency of the sample in the presence of the gradient field. Based on the resonant frequency of the sample, the position of the sample and thus also of the surgical instrument with respect to the gradient field is then determined. To carry out a 3D position measurement, it is proposed to sequentially produce three magnetic field gradients which are mutually orthogonal and linear within the imaging region.

While EP 0 911 642 A2 is generally silent about the timing relation between the actual MR imaging measurement and the probe position measurement, it mentions one embodiment according to which the sample position is determined using three gradient fields produced by the MR apparatus.

Moreover, previously described methods such as in EP 0 911 642 A2 rely on unipolar or bipolar gradient pulses in each dimension of the position determination, which in general cannot be inserted at arbitrary positions in a given MR sequence without altering and/or disturbing and/or precluding the intended spin manipulation of the actual MR sequence. Examples for this are, for instance, (1) encoding perpendicular to the read-out plane during an echo-planar-readout, and (2) position determination during a typical spectroscopy acquisition.

Therefore, there is still a need for improved methods of determining positions of a magnetic field probe in a volume of interest within a magnetic resonance (MR) imaging or spectroscopy arrangement. In particular, it would be desirable to determine the probe position with high temporal resolution throughout and independently of an MR sequence.

SUMMARY OF THE INVENTION

According to the present invention there is provided a method of determining the position of at least one magnetic field probe located within a pre-defined volume of interest within a magnetic resonance (MR) imaging or spectroscopy arrangement, said MR imaging or spectroscopy arrangement comprising:

a main magnet for generating a static magnetic field in said volume of interest, gradient and optionally shim coils for generating gradient and shim magnetic fields, respectively, superimposed to the static magnetic field;

an excitation RF coil for exciting magnetic resonance in an object arranged within said volume of interest;

a receive RF coil for acquiring object MR signals from said object;

a control unit controlling said coils to apply an MR pulse sequence and acquire said object MR signals from said object;

said magnetic field probe being configured to measure a local magnetic field property in a sampling region of said magnetic field probe;

said magnetic field probe comprising a magnetic resonance (MR) active substance present in said sampling region, means for pulsed MR excitation of said substance and means for receiving a probe MR signal generated by said substance;

the method comprising the steps of:

applying a spatially and temporally variable magnetic reference field having a unique time-course at every point in said volume of interest during a preselected time window in which said position shall be determined, said preselected time window substantially overlapping with said pulse sequence;

acquiring probe MR signal from said magnetic field probe during said preselected time window;

determining the position of said probe from said probe MR signal.

The above mentioned pulse sequence for encoding an associated MR response will also be called "encoding sequence". Typically it is one of many known sequences used for MR spectroscopy or MRI measurements (henceforth called "principal measurement").

In the present context, an MR type magnetic field probe generally comprises a magnetic resonance (MR) active substance, means for pulsed MR excitation of said substance and means for receiving an MR signal generated by said substance. It will be understood that in order to provide acceptable signal levels, the MR probes require the presence of a sufficiently intense main magnetic field. Such MR probes have been described e.g. in EP 1 582 886 A1 or in WO 2007/118715 A1.

In principle, the MR magnetic field probes could be operated on an electron spin resonance transition. In an advantageous embodiment, the field probes operate on a nuclear magnetic resonance transition. Examples of suitable nuclei comprise, but are not limited to, $^1$H or $^{19}$F.

Due to the fact that the applied reference field (henceforth also denoted as "reference tone" or just "tone") has a unique time-course at every point in the volume of interest means that the signal induced in the magnetic field probe is bijectively linked to the position of the probe. It will be understood that this requirement shall be met during any preselected time window in which the position determination shall be carried out. In general this means that the spatio-temporal evolution of the reference field shall be linearly independent of the field evolution of the encoding pulse sequence applied to the system and to externally induced field drifts.

Although the principle of this invention works with arrangements featuring just one magnetic field probe, many applications operate with a plurality of magnetic field probes. The method may then be applied for position determination of several field probes.

The reference tones do not need to be spatially linear. It is sufficient that for each time window in which the position shall be determined the spatial distribution induces a signal by the reference tone in such manner that the probes' position can be unambiguously determined also under consideration of potentially available constraints such as a rigid geometry between at least two probes or one probe and the laboratory frame.

The unique signature of the reference field applied to the system allows for extraction of the relevant position information even when applying comparatively weak reference tones. Accordingly, in a preferred embodiment the maximal phase difference of the MR signal induced by said reference field over the examination volume of the MR imaging or spectroscopy measurement is smaller than $\pi$.

The reference tones are preferably signals of temporal zero mean linear and higher order spatial field distributions in the imaging volume to prevent dephasing of the object. In one embodiment, the reference field is periodic; in particular, the reference field can be temporally sinusoidal (harmonic) signals. Periodic signals offer the advantage that they reach a steady state of the eddy currents. In that case, the amplitude of the tone remains constant and the field pattern remains also constant.

In one specific embodiment, the sinusoidal reference tones have spectral positions in the signal acquired by the field probes that are not occupied by the principal MR measurement defined by the encoding pulse sequence.

Alternatively, if there are no sufficient unoccupied gaps in the spectrum of the encoding sequence, the spatio-temporal profile of the reference fields can be orthogonalized to the field evolution of the encoding sequence. This can be done by filtering or subtracting all field evolutions that correlate with the signal evolution of the encoding sequence within each of the intervals within which the probe position shall be determined.

The spatio-temporal distribution of the reference field can be calibrated by scanning one or multiple magnetic field sensors at predetermined positions in the volume of interest recording the reference tone to be used or alternatively the impulse response function of the used system to generate the reference field.

As generally known in the field of MR, the MR pulse sequence comprises a train of sequence modules with a sequence repetition period $T_R$ between each pair of successive sequence modules. Preferably, the reference field is periodic with a reference period $T_F$, with the provision that $T_R$ is larger than $T_F$. In particular, it is advantageous if $T_R > 3$ $T_F$, preferably $T_R > 5$ $T_F$, more preferably $T_R > 10$ $T_F$. Basically this means that determination of the magnetic field probe position can be carried out with good temporal resolution as compared to the time scale given by the MR sequence repetition period.

In some embodiments a plurality of magnetic field probes are operated. As explained in EP 1 582 886 A1, it may be advantageous to operate them in a temporally interleaved manner, which can be for individual probes or for groups of probes.

The method of the present invention can be employed to determine positions of a field probe in directions not covered by the principal MR measurement at a given time, e.g. in a slice direction during a read-out within the plane or single voxel spectroscopy readouts.

In one embodiment, the applied reference field in a given direction is substantially a gradient magnetic field. However, in other embodiments the reference field can be applied by shim-coils producing higher order fields or by multipole magnets.

The position information derived from the magnetic field probe(s) can be exploited for various purposes, such as:
  field monitoring autocalibration
  motion detection
  motion tracking
  motion correction, which can be prospective (applied to correct a scan based on the measured position) or retrospective (applied to correct reconstruction and data derived therefrom).

According to an advantageous embodiment, the position derived from the magnetic field probe(s) is used for position determination/tracking of an interventional device such as a catheter tip.

In order to determine an appropriate spatio-temporal evolution of the reference tones to be applied in a particular setting, one may carry out a measurement of the field evolution by means of a dynamic magnetic field camera working with magnetic field probes of the type also used for the present invention.

In certain situations, however, the field evolution of the principal measurement may be known a priori with sufficient accuracy.

In some cases, e.g. when the several probes are mounted on a stereotactic rigid frame, the known relative positions of two or more probes can be used to improve the determination of the position and angulations said groups by incorporating the known relative positions as constraint in the regression of the position from the probe signal. Moreover a set of rigidly mounted probes can improve the knowledge of the spatial temporal evolution of the reference field during the measurement which can in turn be used to enhance the position determination of the movable probes.

BRIEF DESCRIPTION OF THE DRAWINGS

The above mentioned and other features and objects of this invention and the manner of achieving them will become more apparent and this invention itself will be better understood by reference to the following description of various embodiments of this invention taken in conjunction with the accompanying drawings, wherein are shown.

DETAILED DESCRIPTION OF THE INVENTION

Figure 1:
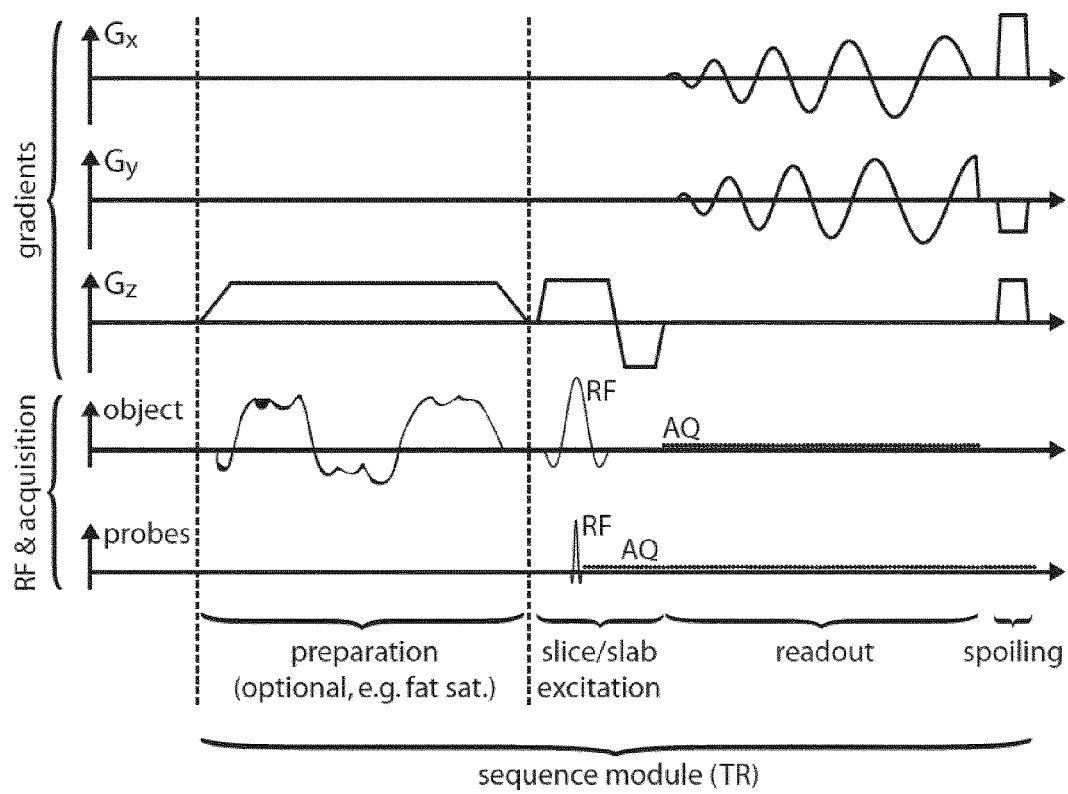
FIG. 1 a typical MR sequence.

As shown in FIG. 1, a typical MR sequence consists of sequence modules that are repeatedly played out with minor changes (e.g. different phase encoding or preparation pulse) in consecutive executions. Each sequence module is composed of sequence portions such as the slice/slab/volume excitation, the readout, spoiling and one or several preparations.

Figure 2:
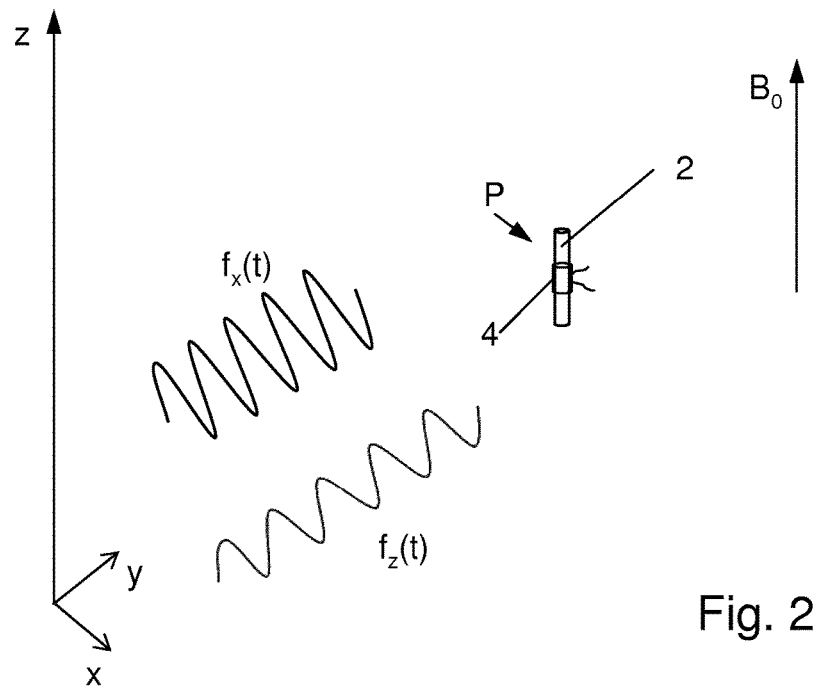
FIG. 2 a basic arrangement for the observation by means of four NMR field probes.

In the arrangement shown in FIG. 2, there is just one single magnetic field probe (P) located in a main magnetic field ($B_0$) of a magnetic resonance arrangement. Typically this will be a nuclear agnetic resonance (NMR) spectroscopy or a magnetic resonance imaging (MRI) imaging setup. In this example the magnetic field probe comprises a magnetic resonance (MR) active substance 2 enclosed inside a small tube and means such as a surrounding solenoid 4 serving for pulsed MR excitation of the MR active substance and also for receiving an MR signal generated by the MR active substance. It is understood that the excitation and receiving means comprise further components not shown in these drawings, particularly electronic components for generating the RF excitation pulse and other electronic components for receiving and processing the probe signal. It is also understood that a design with a single solenoid is merely one of many possible configurations. Also shown schematically are two spatio-temporal magnetic reference fields $f_x(t)$ and $f_z(t)$ oscillating in x direction and z direction, respectively, and having different frequencies.

Figure 3:
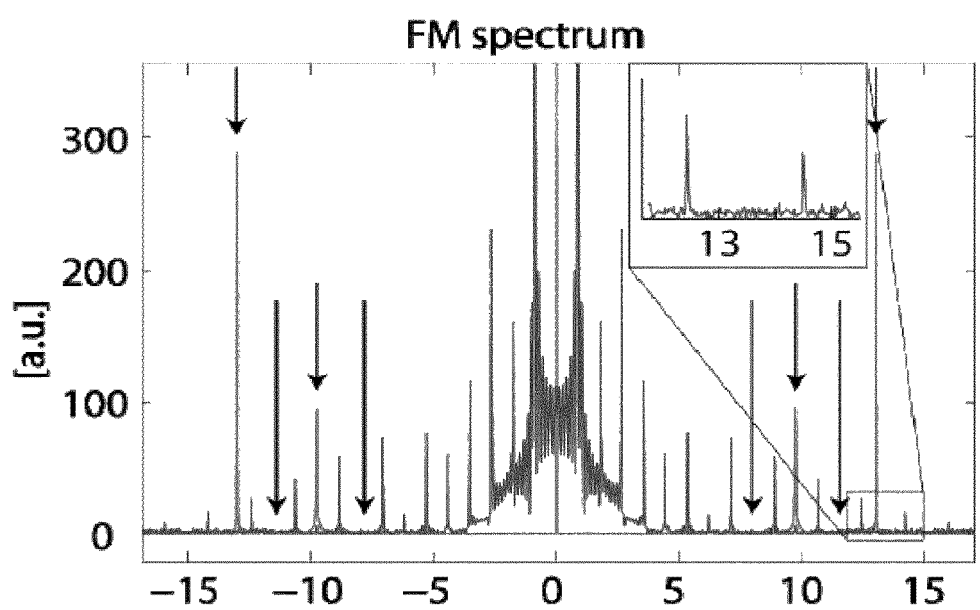
FIG. 3 Spare bands of the gradient waveform permit the introduction of reference tones.

Although the signal spectrum acquired by an NMR field probe during scanning is typically very broad, its frequency modulation (FM) spectrum reflecting the dynamics of the local magnetic field is rather narrow-band and usually sparsely occupied. This is shown in FIG. 3 by the blue plot, representing the FM spectrum measured by a field probe during a single-shot EPI scan. As indicated by the arrows, there are bands within that spectrum that are essentially unoccupied by the gradient waveform. The principle underlying the method of this invention is to use such spare frequency bands to superimpose small reference oscillations to the gradient waveform. In a field probe signal, the FM amplitude of such a reference "tone" indicates the probe's current position along the respective gradient direction. To encode all three coordinates of a probe, three orthogonal tones can be introduced, one in each gradient chain. In order not to cause accrual of MR phase deviations, the tones should have zero mean. A convenient way of meeting all of these requirements is by simple sinusoidal tones, each in a different spare frequency band. Two such tones at 10 kHz and 13 kHz, are shown in FIG. 2 (red). Should no spare bands be available, the gradient waveform could alternatively be orthogonalized to the tones, e.g., by simple narrowband stop-band filtering at the tone frequencies, which has marginal influence on the k-space trajectory itself.

Example

Set-Up

Experiments were performed in a 3T Philips Achieva system, using up to four $^{19}$F field probes (hexafluorobenzene, doped with $Cr(dpm)_3$) for field monitoring. Throughout, tones at 10 kHz and 13 kHz of nominal 2 mT/m were used in the x and y gradients. The response of the gradient system at those frequencies was calibrated once with a fixed setup, which was then moved during the subsequent measurements.

Results

Figure 4:
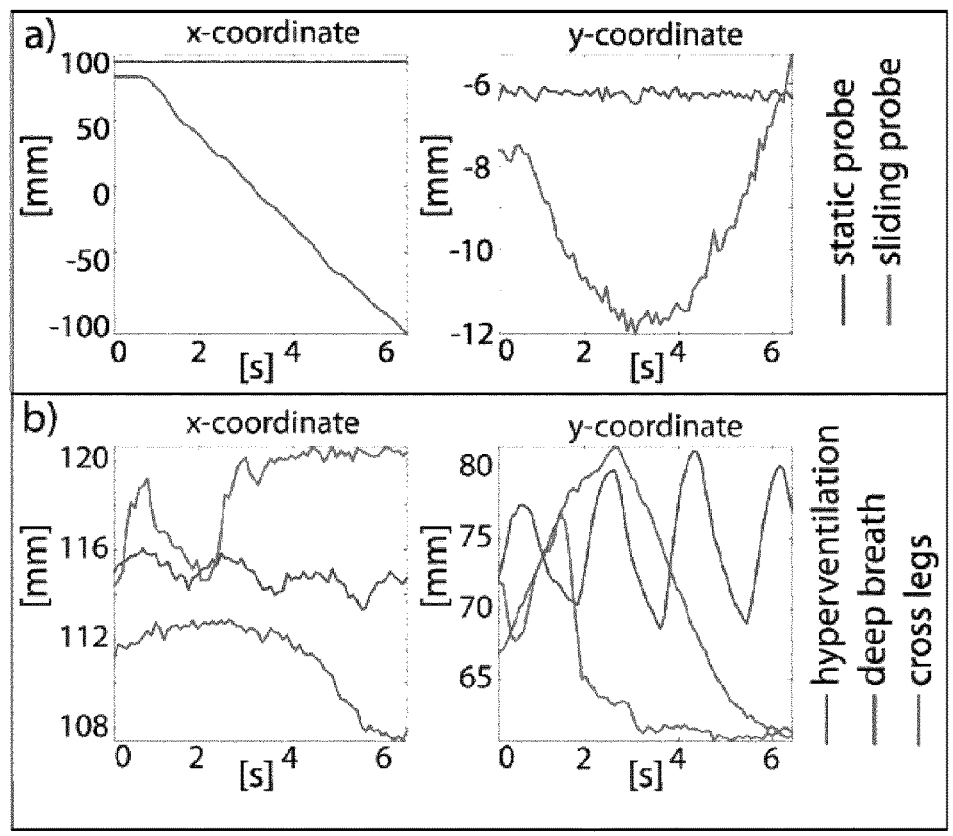
FIG. 4 Tracking of field probes by reference gradient tones.
Figure 5:
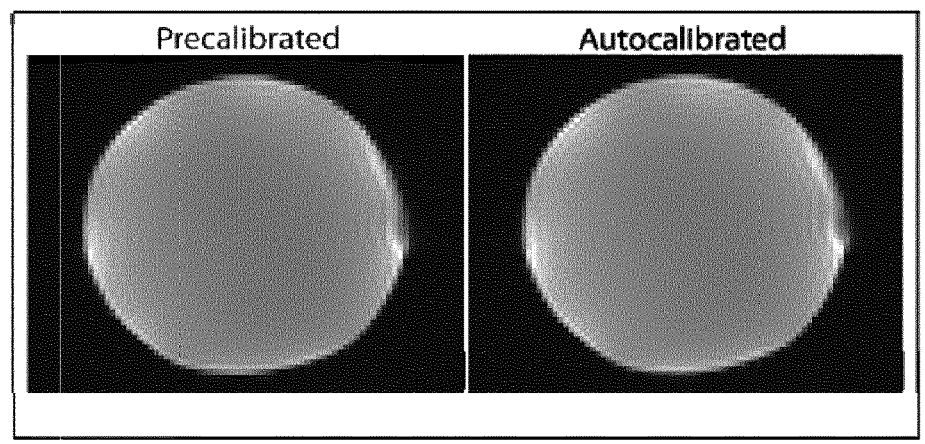
FIG. 5 Single-shot echo-planar imaging (EPI) images reconstructed based on pre- and autocalibrated monitoring data.

FIG. 4a) shows probe positions tracked by 76 dynamic acquisitions of 50 ms duration and TR=80 ms. The blue plot was obtained from a static probe, demonstrating a precision in the order of 100 µm, whereas the green line shows a probe that was moved from left to right across the slightly concave scanner bed. FIG. 4b) shows results from a probe attached to the chest of a volunteer performing hyperventilation (blue), one deep breath (green) and crossing his legs during the dynamic series. To demonstrate the suitability of such position information for monitoring autocalibration, single-shot gradient-echo EPI (FOV=230 mm, resolution=3 mm) of a water phantom was performed in the presence of the tones and with concurrent monitoring by four field probes. The tones perturbed the original k-space trajectory by less than 1/10 of the Nyquist sampling interval in standard deviation, thus not impairing image encoding. FIG. 5 shows resulting images reconstructed based on the monitored k-space trajectories. The left image was obtained using reference values of the probe positions taken by a separate calibration scan. The right image was reconstructed with autocalibration, i.e. based on probe coordinates obtained from the tone signals only.

Discussion

It has been shown that field monitoring can be autocalibrated by reference tones, thus removing the need for separate calibration scans. This approach is especially useful if the monitoring probes cannot be rigidly mounted. In particular, it enables field monitoring with probes mounted on surface coils or flexible arrays, e.g., for abdominal and cardiac imaging. Since eddy currents and gradient fields respond linearly to the gradient waveform, the spectral separation of trajectory and tone is also sustained in the presence of eddy current confounds. Most other field perturbations such as drifts and physiologically generated fields are of much lower frequency and thus also orthogonal to the tones. The latter are of very small bandwidth and small amplitude and can therefore be generated very reproducibly. Importantly, the trajectory perturbations caused by the tones are monitored along with the original field evolution and thus do not impair image reconstruction as long as they are small. Potential confounding effects are imperfect spatial linearity of the gradient fields, which could in fact partly be caused by steady-state eddy currents induced by the tones, as well as non-linear gain of the gradient amplifiers. However, by careful system characterization at the tone frequencies, these effects can be eliminated such as to derive a strict bijection of individual modulation amplitudes and spatial coordinates.

CONCLUDING REMARKS

The use of "weak" reference tones with a small moment means that the principal measurement, e.g. image encoding, will not be disturbed, meaning that the inverse problem of image reconstruction remains a well-posed problem. Usually the imaging encoding in MR sequences is made by means of the spatial phase differences induced by the gradients. This implies that across the volume that is being excited during the experiment no local phase differences are induced that would be comparable to the phase differences of the image encoding, i.e. π.

In spectroscopy applications the phase difference induced by the reference field across a single voxel must be small. As these voxels are typically much smaller than imaging volumes in comparable objects, the above prerequisite also applies to the case of spectroscopy.

If the probes are very sensitive, the effects caused by the reference tones can be kept so small that they have no appreciable influence on image reconstruction.

For the spatially and temporally linear case there are three channels across which one can apply a field, each of which is essentially a linearly independent gradient of the magnetic field in direction of the main magnetic field as a function of the input signal f(t), namely: $B_i=G_i*r_i*f_i(t)$ for i=1 to 3.

In particular, the signals for position determination can be harmonics with different frequencies that are not being used by the encoding sequence: $f_i(t)=A_i*\sin(\omega_i t)$.

Accordingly, the maximal induced gradient moments ($M_G$) remain small for high frequencies of the reference signals: $M_G \alpha \ 1/\omega \ A_i*\cos(\omega*t)$.

As typical gradient pulses of MR sequences make little use of comparatively high frequencies, it is convenient to use harmonic reference tones in such high frequency bands.

An alternative is to use lower frequency bands that are substantially unused by the encoding sequences.

If this is not the case, it is sufficient to orthogonalize the reference signal with respect to the sequence signal or at least to ensure that in any time interval in which positions shall be determined the reference tone has a component that is linearly independent of the remaining MR sequence.

The reference tones and the signal from the gradient pulses of the encoding sequence are then acquired simultaneously by the probes.

The signal contribution of the reference tones provides direct information about the probe position. This can be achieved either directly via knowledge of the spatial and temporal behavior of the induced reference field, or by means of a preceding calibration of the positions in a separate measurement. The data of the principal MR measurement can then be reconstructed either directly or by taking into account the probe signals and/or the probe positions.

The invention claimed is:

1. A method of determining the position of at least one magnetic field probe located within a pre-defined volume of interest within a magnetic resonance (MR) imaging or spectroscopy arrangement, said magnetic field probe being configured to measure a local magnetic field property in a sampling region of said magnetic field probe;

said magnetic field probe comprising a magnetic resonance (MR) active substance present in said sampling region, means for pulsed MR excitation of said substance and means for receiving a probe MR signal generated by said substance;

the method comprising the steps of:
applying an MR pulse sequence for acquiring object MR signals from an object arranged within the volume of interest;
applying a spatially and temporally variable magnetic reference field having a unique time-course at every point in said volume of interest during a preselected time window in which said position shall be determined, said preselected time window substantially overlapping with said pulse sequence, wherein said reference field is sinusoidal in time;
applying a pulsed MR excitation of said MR active substance and acquiring probe MR signal from said magnetic field probe during said preselected time window;
determining the position of said probe from said probe MR signal;

wherein said sinusoidal reference signal has a frequency WR located in a substantially unoccupied region of the frequency spectrum of said probe MR signal when the latter is acquired without applying said magnetic reference signal;

wherein said MR pulse sequence comprises a train of sequence modules with a sequence repetition period TR between each pair of successive sequence modules, and wherein said reference field is periodic with a reference period TF, with the provision that TR is larger than TF; and, wherein $T_R > 5 \ T_F$.

2. A method of determining the position of at least one magnetic field probe located within a pre-defined volume of interest within a magnetic resonance (MR) imaging or spectroscopy arrangement, said magnetic field probe being configured to measure a local magnetic field property in a sampling region of said magnetic field probe;

said magnetic field probe comprising a magnetic resonance (MR) active substance present in said sampling region, means for pulsed MR excitation of said substance and means for receiving a probe MR signal generated by said substance;

the method comprising the steps of:
applying an MR pulse sequence for acquiring object MR signals from an object arranged within the volume of interest;
applying a spatially and temporally variable magnetic reference field having a unique time-course at every point in said volume of interest during a preselected time window in which said position shall be determined, said preselected time window substantially overlapping with said pulse sequence, wherein said reference field is sinusoidal in time;
applying a pulsed MR excitation of said MR active substance and acquiring probe MR signal from said magnetic field probe during said preselected time window;
determining the position of said probe from said probe MR signal, wherein said sinusoidal reference signal has a frequency WR located in a substantially unoccupied region of the frequency spectrum of said probe MR signal when the latter is acquired without applying said magnetic reference signal;

wherein said MR pulse sequence comprises a train of sequence modules with a sequence repetition period TR, between each pair of successive sequence modules, and wherein said reference field is periodic with a reference period TF, with the provision that TR is larger than TF; and, wherein $T_R > 10 \ T_F$.

* * * * *